(12) United States Patent  
Klapatch et al.

(10) Patent No.: US 9,146,294 B2  
(45) Date of Patent: Sep. 29, 2015

(54) BUILT-IN TEST INJECTION FOR CURRENT SENSING CIRCUIT

(75) Inventors: Robert D. Klapatch, Wethersfield, CT (US); William E. Villano, Canton, CT (US)

(73) Assignee: Hamilton Sundstrand Corporation, Windsor Locks, CT (US)

(*) Notice: Subject to any disclaimer, the term of this patent is extended or adjusted under 35 U.S.C. 154(b) by 612 days.

(21) Appl. No.: 13/553,162

(22) Filed: Jul. 19, 2012

(65) Prior Publication Data

US 2014/0021971 A1     Jan. 23, 2014

(51) Int. Cl.
*G01R 31/3187* (2006.01)
*G01R 35/02* (2006.01)
*G01R 15/18* (2006.01)

(52) U.S. Cl.
CPC ............... *G01R 35/02* (2013.01); *G01R 15/18* (2013.01)

(58) Field of Classification Search
CPC .... G01R 35/00; G01R 31/3012; G01R 15/18; G01R 15/183; G01R 15/185; H01F 35/28; H01F 38/30; H01F 38/32; H01F 27/427
See application file for complete search history.

(56) References Cited

U.S. PATENT DOCUMENTS 6,160,697 A * 12/2000 Edel .............................. 361/143  
2008/0278871 A1* 11/2008 Shaak et al. ................... 361/42

OTHER PUBLICATIONS

Survey of Instrumentation and Measurement, Stephen A. Dyer, ed., pp. 260-263, 2001, see, e.g., p. 262, Fig. 5.*  
Damon Mount, Test & Measuremen—A Primary Injection Primer, Feb. 4, 2011, available at http://www.electricalreview.co.uk/features/7460-119663.*

* cited by examiner

*Primary Examiner* — Melissa Koval  
*Assistant Examiner* — Daniel Miller  
(74) *Attorney, Agent, or Firm* — Kinney & Lange, P.A.

(57) ABSTRACT

A current sense system includes a current transformer having a primary coil and a secondary coil, wherein the secondary coil has a first and second terminal; a burden resistor connected between the first terminal of the secondary coil and ground; a monitor circuit that measures current in the primary coil by monitoring voltage across the burden resistor; and a built-in test (BIT) circuit connected to the second terminal of the secondary coil. The BIT circuit provides a virtual ground during normal operation, and either a positive voltage or a negative voltage during test operations.

11 Claims, 2 Drawing Sheets

BUILT-IN TEST INJECTION FOR CURRENT SENSING CIRCUIT

BACKGROUND

The present invention relates to built-in test (BIT), and in particular to BIT for a current sensing circuit.

Current sensing circuits typically employ a current transformer to monitor current in a system. The current in the system passes through the primary coil of the transformer, which generates a proportional current in the secondary coil of the transformer based upon the ratio of turns in each coil. This proportional current flows through a burden resistor in order to create a voltage that is measurable by a monitor circuit.

Current sensing circuits are tested to ensure proper functionality. In the past, this involved using separate circuitry to inject currents directly to the burden resistor in order to test the monitor circuit. This is not ideal in that it requires external circuitry, and does not test the current transformer itself.

SUMMARY

A current sense system includes a current transformer, a burden resistor, a monitor circuit, and a built-in test (BIT) circuit. The current transformer has a primary coil and a secondary coil. The secondary coil has a first and second terminal. The burden resistor is connected between the first terminal of the secondary coil and ground. The monitor circuit measures current in the primary coil by monitoring voltage across the burden resistor. The BIT circuit is connected to the second terminal of the secondary coil. The BIT circuit provides a virtual ground during normal operation, and either a positive voltage or a negative voltage during test operations.

DETAILED DESCRIPTION

The present invention describes a system and method for providing built-in test (BIT) injection for current sensing circuits that employ a current transformer. One terminal of the secondary coil of the current transformer is connected to the output of an operational amplifier (op-amp) circuit. During normal system operation, the output of the op-amp circuit provides a virtual ground, and therefore does not alter the current flowing through the secondary coil. During test, the op-amp circuit can either inject a positive direct-current (DC) current or a negative DC current to the secondary coil of the current transformer, depending on the input to the op-amp. The current through the secondary coil is then measured by a monitor circuit that includes a rectifier and an analog-to-digital converter. This monitor circuit is used during normal system operation to monitor the alternating-current (AC) current through the primary coil of the current transformer. In this way, the current sensing circuit, including the current transformer, can be tested at any time, without external circuitry or physical presence at the system.

Figure 1:
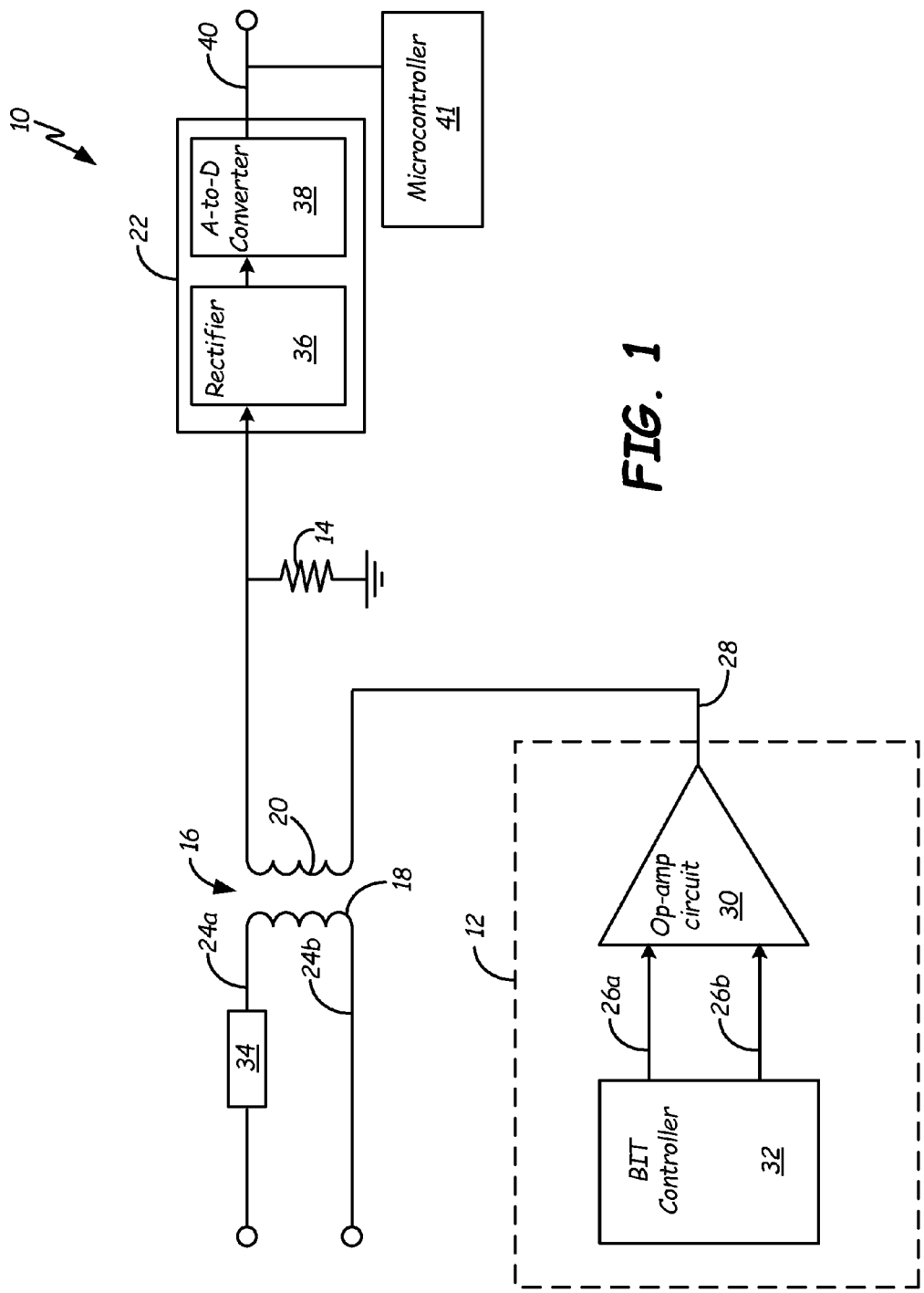
FIG. 1 is a block diagram illustrating a system for providing built-in-test (BIT) injection for a current sensing circuit according to an embodiment of the present invention.

FIG. 1 is a block diagram illustrating system 10 for providing built-in test (BIT) injection for a current sensing circuit according to an embodiment of the present invention. System 10 includes BIT circuit 12, burden resistor 14, current transformer 16, primary coil 18, secondary coil 20, signal monitor circuit 22, primary coil terminals 24a and 24b, and relay 34. BIT circuit 12 includes op-amp circuit inputs 26a and 26b, BIT circuit output line 28, op-amp circuit 30, and BIT controller 32. Signal monitor circuit 22 includes rectifier 36, analog-to-digital (A-D) converter 38, and output 40. Output 40 may be provided to, for example, microcontroller 41 capable of analyzing a digital signal such as an electronic engine controller (EEC) onboard an engine of an aircraft. BIT controller 32 is any microcontroller capable of outputting voltage to op-amp circuit 30 such as, for example, a field programmable gate array (FPGA). BIT controller 32 may be implemented as a part of an EEC.

BIT circuit 12 provides three distinct output states to secondary coil 20 on BIT circuit output line 28. The first state, which is used during normal system operation, provides a virtual ground on output line 28. This allows the AC current generated in secondary coil 20 during normal system operation to flow through burden resistor 14 as if secondary coil 20 were connected to ground. In the second state, BIT circuit 12 provides a positive voltage on output line 28 in order to inject a positive DC current through secondary coil 20. In the third state, BIT circuit 12 provides a negative voltage on output line 28 in order to inject a negative DC current through secondary coil 20.

In one embodiment, op-amp circuit 30 is an operational amplifier implemented as a differential amplifier with input 26a as the non-inverting input and input 26b as the inverting input. Op-amp circuit inputs 26a and 26b are connected to BIT controller 32. BIT controller 32 provides four possible binary input combinations to op-amp circuit 30. These inputs may be generated, for example, using outputs of metal-oxide-semiconductor field-effect transistors (MOSFETs) that produce output voltages of, for example, 3.3 volts. If the voltage on input 26a is a logic high value and the voltage on input 26b is a logic low value, the output provided on BIT circuit output line 28 will be a known positive voltage based upon the characteristics of the differential amplifier. If the voltage on input 26a is a logic low value and the voltage on input 26b is a logic high value, the output provided on BIT circuit output line 28 will be a known negative voltage based upon the characteristics of the differential amplifier. If the voltages on both inputs 26a and 26b are logic low values, there will be no output of BIT circuit 12 and the output provided on BIT circuit output line 28 will act as a virtual ground for system 10. The final state, both inputs 26a and 26b being logic high values, will also produce a virtual ground, but is not necessary because it is redundant with the state of both inputs 26a and 26b being logic low values.

During normal system operation, BIT controller 32 provides logic low voltage on both inputs 26a and 26b. AC current flows through primary coil 18, and in turn an AC current is generated in secondary coil 20 that is proportional to the current in primary coil 18. BIT circuit 12 acts as a virtual ground so AC current flows through secondary coil 20 and burden resistor 14. This creates an AC voltage across burden resistor 14. Rectifier 36 receives the AC voltage across burden resistor 14 and provides a unidirectional voltage to A-D converter 38. A-D converter 38 then provides a digital output representative of the root mean square (RMS) voltage from rectifier 36. This digital output is representative of the AC current present in primary coil 18. Output 40 is used, for example, by a controller that implements digital logic to verify that the digital output is representative of the expected current through primary coil 18.

During a first BIT injection test, BIT controller 32 provides a logic high voltage on input 26a and a logic low voltage on input 26b such that a positive voltage is generated at the output of op-amp circuit 30, creating a DC current through secondary coil 20. Although not required, the current flowing through primary coil 18 may be terminated prior to initiating this BIT injection test using relay 34. This allows for easier testing in that there is no AC current present in the system during the test. The positive voltage generated at the output of op-amp circuit 30 creates a DC current that flows through secondary coil 20 and burden resistor 14. This creates a positive DC voltage across burden resistor 14. This positive voltage passes through the positive voltage path of rectifier 34 and is provided to A-D converter 38. A-D converter 38 provides a digital output to controller 38 representative of the voltage provided by rectifier 36. Output 40 is then verified to determine that the BIT injection test was performed successfully using, for example, digital logic. If the test is unsuccessful, a failed test is indicated. A failed test indication is implemented as any common indication method, such as setting a bit or illuminating an light emitting diode (LED).

During a second BIT injection test, BIT controller 32 provides a logic low voltage on input 26a and a logic high voltage on input 26b such that a negative voltage is generated at the output of op-amp circuit 30. Although not required, the current flowing through primary coil 18 may be terminated prior to initiating this BIT injection using, for example, a relay. The negative voltage generated at the output of op-amp circuit 30 creates a DC current that flows through secondary coil 20 and burden resistor 14. This creates a negative voltage across burden resistor 14. This negative voltage passes through the negative voltage path of rectifier 36, is converted into a positive voltage and provided to A-D converter 38. A-D converter 38 provides a digital output on output 40 representative of the voltage provided by rectifier 36. Output 40 is then verified to determine that the BIT test was performed successfully using, for example, digital logic. By injecting both a positive and a negative DC voltage, rectifier 36 can be fully tested. If the test is unsuccessful, a failed test is indicated.

Figure 2:
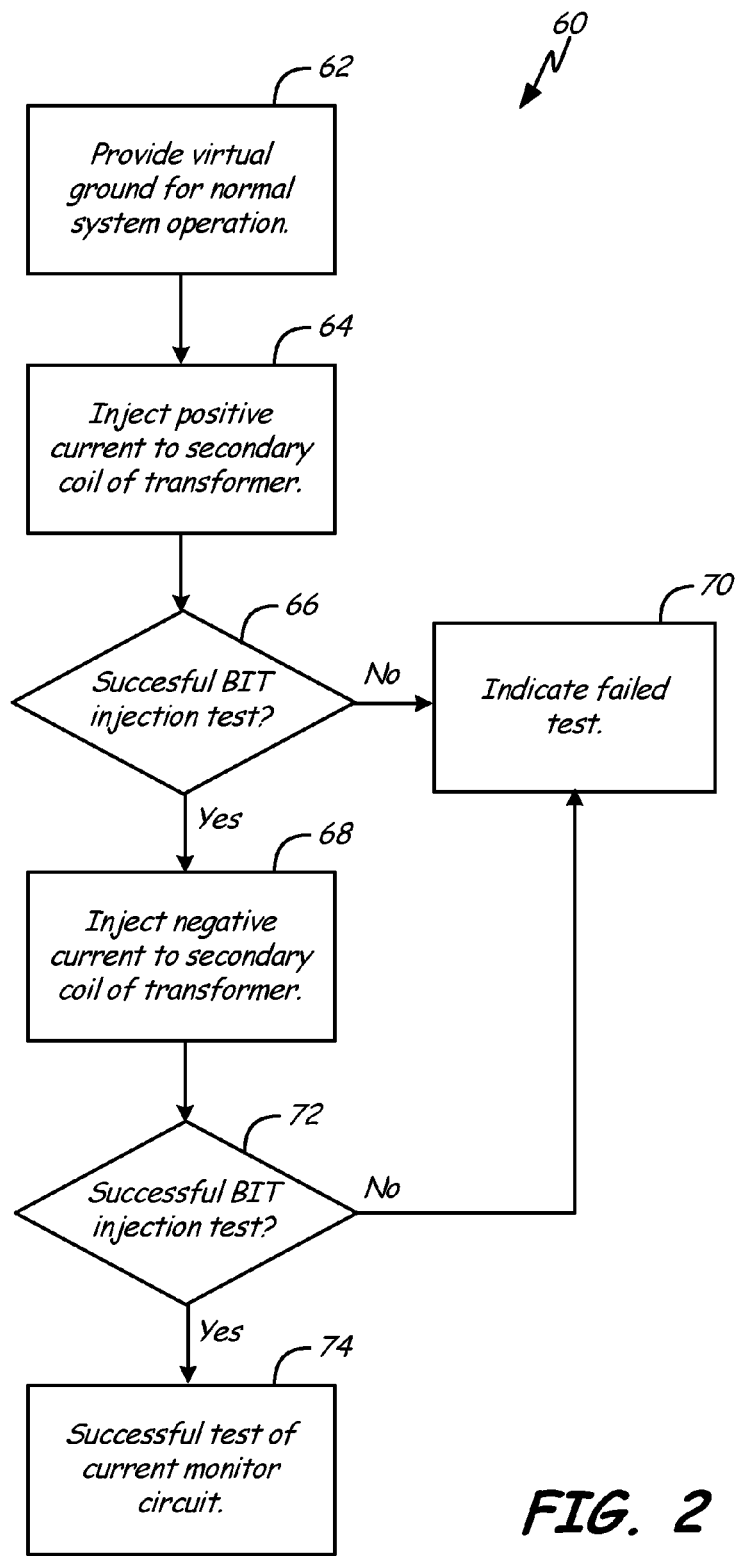
FIG. 2 is a flowchart illustrating a method for providing BIT injection for a current sensing circuit according to an embodiment of the present invention.

FIG. 2 is a flowchart illustrating a method 60 for providing BIT injection for a current sensing circuit according to an embodiment of the present invention. At step 62, BIT controller provides a logic low voltage to both inputs of op-amp circuit 30 to provide a virtual ground during normal system operation. AC current is flowing through primary coil 18 which generates an AC current in secondary coil 20 that flows through burden resistor 14. Monitor circuit 22 provides a digital output on output 40 for verification. At step 64, BIT controller 32 provides a logic high voltage to the non-inverting input of op-amp circuit 30 and a logic low voltage to the inverting input of op-amp circuit 30 in order to provide positive current injection to secondary coil 20. At step 66, monitor circuit 22 provides a digital output on output 40 to be verified. If the injection test was successful, method 60 proceeds to step 68. If the injection test was unsuccessful, method 60 proceeds to step 70. At step 68, BIT controller 32 provides a logic low voltage to the non-inverting input of op-amp circuit 30 and a logic high voltage to the inverting input of op-amp circuit 30 in order to provide negative current injection to secondary coil 20. At step 72, monitor circuit 22 provides a digital output on output 40 to be verified. If the injection test was successful, method 60 proceeds to step 74. If the injection test was unsuccessful, method 60 proceeds to step 70. At step 74, the injection tests were successful and normal system operation resumes. At step 70, an unsuccessful test is indicated.

In this way, the present invention describes a system and method for providing built-in test (BIT) for circuits that employ current sensing through the use of a current transformer. Although the present invention has been described with reference to preferred embodiments, workers skilled in the art will recognize that changes may be made in form and detail without departing from the spirit and scope of the invention.

The invention claimed is:

1. A current sense system comprising:
 a current transformer having a primary coil and a secondary coil, wherein the secondary coil has a first and second terminal;
 a burden resistor connected between the first terminal of the secondary coil and ground;
 a monitor circuit that measures current in the primary coil by monitoring voltage across the burden resistor; and
 a built-in test (BIT) circuit connected to the second terminal of the secondary coil, wherein the BIT circuit comprises:
  an operational amplifier circuit having an output connected to the second terminal of the secondary coil; and
  a first controller configured to control a state of the operational amplifier circuit, wherein the first controller provides a first output and a second output to control the state of the operational amplifier circuit; and
  wherein the first and second outputs are logic low values to operate in a first state in which the output of the operational amplifier is a virtual ground, wherein the first output is a logic high value and the second voltage is a logic low value to operate in a second state in which the output of the operational amplifier is a positive voltage, and wherein the first output is a logic low value and the second output is a logic high value to operate in a third state in which the output of the operational amplifier is a negative voltage.

2. The system of claim 1, wherein the operational amplifier circuit is implemented as a differential amplifier.

3. The system of claim 1, wherein the monitor circuit comprises:
 a rectifier that converts an alternating current (AC) voltage to direct current (DC) voltage; and
 an analog-to-digital converter that converts the DC voltage provided by the rectifier to a digital output.

4. The system of claim 3, further comprising a second controller that verifies the digital output of the analog-to-digital converter.

5. A built-in test (BIT) injection circuit for testing a current transformer and monitor circuit, the circuit comprising:
 a differential amplifier having an output connected to a secondary coil of the current transformer, the differential amplifier operating in a first state in which the output of the differential amplifier is a virtual ground, a second state in which the output of the operational amplifier is a positive voltage to test the secondary coil of the current transformer and the monitor circuit, and a third state in which the output of the operational amplifier is a negative voltage to test the secondary coil of the current transformer and the monitor circuit; and
 a controller that provides input to control the state of the output of the differential amplifier, wherein the controller operates the differential amplifier in the first state during normal operation and the second and third states during BIT operations; and wherein the controller provides a first output and a second output to control the state of the differential amplifier, wherein the first and second outputs are logic low values to operate in the first state, and wherein the first output is a logic high value and the second voltage is a logic low value to operate in the second state, and wherein the first output is a logic low value and the second output is a logic high value to operate in the third state.

6. The circuit of claim 5, wherein the monitor circuit comprises:
   a rectifier that converts alternating current (AC) voltage to direct current (DC) voltage; and
   an analog-to-digital converter that converts the DC voltage from the rectifier to a digital output.

7. A method for providing built-in test (BIT) injection from a BIT circuit, the method comprising:
   providing a virtual ground at an output of the BIT circuit during normal system operation, wherein providing the virtual ground includes providing first and second outputs each as logic low values from a BIT controller to an operational amplifier;
   providing a positive voltage at the output of the BIT circuit to test a secondary coil of a current transformer and a monitor circuit, wherein the current transformer and monitor circuit are utilized to monitor a current through a primary coil of the current transformer during normal system operation, and wherein providing the positive voltage at the output of the BIT circuit includes providing, from the BIT controller to the operational amplifier, the first output as a logic high value and the second output as a logic low value; and
   providing a negative voltage at the output of the BIT circuit to test the secondary coil of the current transformer and the monitor circuit, wherein providing the negative voltage at the output of the BIT circuit includes providing, from the BIT controller to the operational amplifier, the first output as a logic low value and the second output as a logic high value.

8. The method of claim 7, wherein providing a positive voltage comprises:
   controlling the operational amplifier circuit to output a positive voltage to create a current through the secondary coil of the current transformer and a burden resistor using the BIT controller; and
   monitoring a voltage across the burden resistor using the monitor circuit.

9. The method of claim 7, wherein providing the negative voltage comprises:
   controlling the operational amplifier circuit to output a negative voltage to create a current through the secondary coil of the current transformer and a burden resistor using the BIT controller; and
   monitoring a voltage across the burden resistor using the monitor circuit.

10. The method of claim 7, wherein monitoring a voltage across the burden resistor comprises:
    rectifying the voltage using a rectifier, wherein a positive voltage passes through a first path of the rectifier, and a negative voltage passes through a second path of the rectifier; and
    converting the voltage from an analog voltage to a digital signal using an analog-to-digital converter.

11. The method of claim 10, further comprising verifying an output of the analog-to-digital converting using a microcontroller.

* * * * *